United States Patent
McFeely et al.

(10) Patent No.: US 6,984,415 B2
(45) Date of Patent: Jan. 10, 2006

(54) DELIVERY SYSTEMS FOR GASES FOR GASES VIA THE SUBLIMATION OF SOLID PRECURSORS

(75) Inventors: F. Read McFeely, Ossining, NY (US); Deborah A. Neumayer, Danbury, CT (US); John J. Yurkas, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 970 days.

(21) Appl. No.: 09/378,502

(22) Filed: Aug. 20, 1999

(65) Prior Publication Data

US 2002/0009544 A1 Jan. 24, 2002

(51) Int. Cl.
*C23C 16/00* (2006.01)

(52) U.S. Cl. .................. 427/248.1; 427/250; 427/372.2
(58) Field of Classification Search .............. 427/248.1, 427/255.28, 372.2, 250
See application file for complete search history.

(56) References Cited

U.S. PATENT DOCUMENTS

| | | | | |
|---|---|---|---|---|
| 4,196,233 A | * | 4/1980 | Bitzer et al. ................ 427/255 |
| 4,645,689 A | * | 2/1987 | Cox ......................... 427/255.2 |
| 4,851,296 A | * | 7/1989 | Tenhover et al. ............ 427/255 |
| 4,980,198 A | * | 12/1990 | Dowben et al. .......... 427/255.3 |
| 5,232,869 A | * | 8/1993 | Frigo et al. .................. 427/124 |
| 5,553,395 A | * | 9/1996 | Wen et al. ................ 427/248.1 |
| 5,580,822 A | * | 12/1996 | Hayakawa et al. .......... 427/250 |
| 5,603,169 A | * | 2/1997 | Kim .............................. 34/587 |
| 5,656,338 A | * | 8/1997 | Gordon ....................... 427/576 |
| 5,675,028 A | * | 10/1997 | Neumayer et al. ............. 552/4 |
| 5,698,022 A | * | 12/1997 | Glassman et al. ........... 427/255 |
| 5,919,522 A | * | 7/1999 | Baum et al. .............. 427/255.2 |
| 5,952,046 A | * | 9/1999 | Chayka .................... 427/249.1 |
| 5,966,499 A | * | 10/1999 | Hinkle et al. ........... 427/255.23 |
| 6,106,898 A | * | 8/2000 | Takamatsu et al. ..... 427/255.21 |
| 6,161,398 A | * | 12/2000 | Partus ........................ 427/127 |

\* cited by examiner

*Primary Examiner*—Bret Chen
(74) *Attorney, Agent, or Firm*—Thomas A. Beck; Marian Underweiser

(57) ABSTRACT

A method of depositing a metal or other desired material onto a substrate using a gas generated via the sublimation of solid material precursors, wherein a sold precursor is introduced into a liquid in a bubbler apparatus so that the bubbler then contains vapors of solid precursor, and then sweeping a carrier gas through the bubbler to a reactor containing a substrate which is coated with the precursor via chemical vapor deposition.

16 Claims, 2 Drawing Sheets

DELIVERY SYSTEMS FOR GASES FOR GASES VIA THE SUBLIMATION OF SOLID PRECURSORS

BACKGROUND OF THE INVENTION

1. Field of the Invention

The present invention relates to a method for improving the delivery system for gases generated from the sublimation of low vapor pressure solids. More particularly, the invention uses an ultra-low vapor pressure liquid, in which the solid is insoluble, as a carrier for particles, the vapor emanating from which is used to form the overlayer in a chemical vapor deposition.

2. Brief Description of the Prior Art

For chemical vapor deposition (CVD), it is necessary to transport a stream of gaseous precursor molecules from a source container into a reactor at sufficient rate to allow for conveniently rapid film growth.

If the precursor is a gas at room temperature, or may be packaged as a liquid under greater than atmospheric pressure, this creates no problem. Normal gas handling equipment, pressure regulators, flow metering valves and the like suffice.

For materials which are liquids, two situations arise. If the vapor pressure is sufficiently high, the vapor itself may be treated analogously to the methods used for compressed gases. For materials which are liquids with lower vapor pressure, handling is generally more complicated, but it has become a matter of standard practice. One method is to use the bubbler depicted in FIG. 1. This arrangement consists of a partially filled vessel, with two valved outlets. The inlet tube extending into the liquid is connected to a compressed gas tank via appropriate pressure regulation and flow rate control devices. Opening the inlet and outlet valves causes a gas (the carrier gas) to bubble into the liquid via the inlet tube, and physically sweep the source gas vapor into the outlet tube and subsequently to the reactor. The delivery rate of the precursor gas may thus be regulated by the flow rate of the carrier gas.

For solid state precursors, the situation is more complicated still. As is the case with liquid precursors, if the solid state precursor is sufficiently volatile, no problem arises; the vapor may be handled and delivered via standard gas handling techniques. However this situation is infrequent. Solids generally have a lower vapor pressure than liquids. For these low volatility precursors, the delivery system and source material itself must be optimized for maximum delivery rate. For the source material, this means using as finely divided a powder as possible, since the delivery of source material to the vapor phase is the product of the specific sublimation rate and the total surface area of the source material.

In addition to delivering the precursor to the reactor at an adequate rate, it is also highly desirable that the delivery system exhibit long term stability. That is, under the same operating conditions, it should supply the same flux of precursor molecules for weeks or months on end. Otherwise, costly and time consuming recalibrations of the deposition process would frequently be necessary. This problem is virtually non-existent for liquid and gaseous precursors, but is especially difficult to circumvent with solid precursors. This is because of the problem of recrystallization. To maximize material delivery, the source is introduced as a fine powder. When the delivery system is not in use, it is valved off, and the source material establishes its equilibrium vapor pressure within the vessel within which it is contained. This solid-gas equilibrium is a dynamic one, in which molecules are continuously being evaporated from and condensed upon each particle. Thus, the individual particles can easily exchange molecules via the gas phase. Thermodynamically, the Gibbs fee energy of the solid phase is minimized when the total surface area is minimized. Thus, large crystallites will grow at the expense of small crystallites. The net effect is that the available surface area per unit mass of precursor will decrease over time rendering the delivery rate of the precursor to the reactor non-constant and declining.

A bubbler obviously cannot be adapted straightforwardly to solid state precursors. Instead of bubbling through a homogeneous liquid, the gas flow from the inlet tube would blow finely powdered precursor material about. This could lead to blowing powders out of the outlet tube, making it impossible to shut off the flow of precursor gas completely and contaminating the system. Filters could be employed to circumvent this problem but they would restrict flow, and would be clearly prone to clogging. In order to reap the benefits of the liquid bubbler delivery system, one could place the solid precursor in a liquid. The choice of a liquid to be employed for this purpose is restricted by the requirements of vapor pressure. The vapor pressure of any liquid considered for this process must be negligible when compared with the vapor pressure of the solid precursor it might possibly contain at operating temperature. The precise operational definition of "negligible" will of course depend upon the specific nature of the reaction or process to be carried out; in particular upon the degree of contamination of the reactant stream by molecules of the carrier liquid that can be tolerated. In addition, the state of aggregation of the solid-liquid system must be considered. The solid could have substantial solubility in the liquid, producing a solution; or it could be insoluble, producing a slurry or emulsion. A sharp distinction will be drawn below between these two cases.

The use of a liquid carrier to contain solid precursor material is found in U.S. Pat. No. 5,232,869 to Frigo et al. The reference to Frigo et al. differs from the present invention in that it (the reference) discloses that the solid is substantially soluble in the liquid disclosed. The partial solubility extolled by the reference is actually detrimental in two regards. First it does nothing to ameliorate the problem of recrystallization which leads to long term irreproducibility; and second, the solubility causes the solution phase to serve as a low vapor pressure sink for the precursor molecules, hindering the efficient transfer of the precursor material to the gas phase. The present invention, by way of illustration, uses a solid $[W(CO)_6]$ suspended in a fluid in which it has no measurable solubility. The present invention is based upon insoluble suspension.

In the Frigo system, the bubbler contains both dissolved precursor and remaining shards of insoluble solid precursor. When this bubbler is allowed to equilibrate, the liquid becomes a saturated solution and the chemical potentials of the solute and the solid are equalized. Frigo et al. clearly envision the gaseous precursor as evaporating from the solution, with the role of the residual solid being to replenish the solute as it is depleted by operation. However, the precursor is delivered to the gas phase both by evaporation from the solution and by direct sublimation from the solid material. Because the solid material is in a dynamic equilibrium with the solution, the solid particles will have the same tendency to recrystallize, with the large particles growing at the expense of the small ones. This is the same problem that affects a vial of strictly solid precursor crystallites. It is just that the particle exchange occurs via solution instead of via the gas phase. Nothing in the Frigo et al. system ameliorates this problem. Thus, over time, while the precursor molecules delivered to the reactor form the homogeneous solution will remain constant over time, the contribution from the direct sublimation of the solid will be subject to the same sorts of variations.

In contrast, consider the situation if the solid is insoluble in the liquid, as is the case in the present invention. Upon evacuation of the space above the liquid, the material from the solid will begin to sublime, forming bubbles and rising to the surface of the liquid and entering the evacuated region. This phenomenon will continue until the head space reaches the equilibrium vapor pressure for the solid, at which point bubbles will no longer be capable of being formed. The situation at that point is that there are solid particles immersed in a liquid which excludes the molecules of the solid, with the vapor held above it. Thus the solid particles are effectively prevented from exchanging material via the gas phase, as they are physically separated from the gas by the barrier provided by the liquid in which the gas is insoluble. Thus particles are essentially isolated from one another and will be unable to recrystallize and change their surface area, which as noted above is a source of long term instability.

One might postulate that the aforestated phenomenon is insignificant if the system of Frigo et al. had a very large ratio of solution to solid particles, but this situation would be undesirable and highlights another advantage of the present invention.

The problem with a system comprising one volatile component, a precursor and a nonvolatile component in which the precursor is dissolved is the problem of vapor pressure lowering. Consider placing two such components separately in a sealed container. The total vapor pressure would be that of the precursor, $p_0$. By way of illustration, suppose the precursor were mixed with the liquid and completely dissolved in it to a mole fraction of 0.2. Raoult's law states that the vapor pressure of the precursor would fall to approximately 0.2 times its undissolved value $p_0$. (Note that the roles of the solid and liquid are reversed in this case from the usual situation in that the solid, not the liquid is the volatile component, however, the analysis is unaffected thereby.) Thus in the situation envisioned by Frigo et al., all of the material dissolved in the liquid is present in a state of reduced vapor pressure, exactly opposite of what is desired. Thus, the problem of recrystallization cannot be solved by having only a negligible amount of solid present without suffering a dramatic decrease in the volatility of the precursor.

Thus dissolving a volatile substance in a non-volatile solvent, which is the procedure disclosed by Frigo, et al., is actually a method of reducing the vapor pressure of the solute. The only factor keeping the vapor pressure of the head space (in a sealed bubbler at equilibrium) from falling is the presence of excess solid material, (if that exists). As the partial pressure of the precursor in the gas phase is reduced, the solution and the residual solid will both respond in accordance with Le Chatlier's Principle. This states that if a physico-chemical system is in equilibrium, a change in any of the factors, such as temperature, pressure and concentration, which determine the conditions of equilibrium will cause the equilibrium to shift in such a way as to nullify the effect of this change. Thus, as precursor vapor is swept away by the carrier gas, both the solution an the residual solid will respond; they will both emit precursor molecules to replace the vapor which has been swept away. However, the solution, as it is depleted, will compete with the gas phase for precursor molecules being emitted from the residual solid. Depending on the relative amounts of solution and residual solid, this could substantially hinder the delivery of precursor to the gas phase.

In conclusion, with the system of a precursor substantially dissolved in an non-volatile liquid, as recommended by Frigo et al., there are two limiting possibilities, both of which suffer from important drawbacks. First, the amount of liquid could be insignificant with respect to the solid. Then the liquid serves only to contain the solid, and contributes negligibly to the delivery of precursor to the gas phase. Then the problem of recrysallization remains unaffected. If the volume of the liquid solution is large and the amount of residual undissolved precursor is small most of the gas delivered will be via solution, ameliorating the problem of instability because of recrystallization, but, as discussed above, that solution will have a lower precursor vapor pressure than the pure precursor. In contrast, if the precursor is insoluble in the liquid, its vapor pressure is not lowered, and the recrysallization is prevented, regardless of relative volumes of the two phases.

SUMMARY OF THE INVENTION

Generally, method of the present invention is an improved delivery system for gases generated via the sublimation of solid material precursors comprising: first, introducing a solid precursor into a liquid bubbler apparatus; adding a liquid to the solid precursor containing bubbler apparatus; the liquid in question is chosen to have a vapor pressure which is negligible compared with the vapor pressure of the solid precursor under the operating conditions extant in the bubbler. The liquid is also chosen such that the solid precursor exhibits limited solubility in said liquid, said solubility being less than about 100 ppm; attaching said bubbler containing said solid precursor and said liquid to reactor apparatus containing a substrate to which the precursor is to be applied. The bubbler contains vapors of solid precursor.

A carrier gas is passed through the bubbler to sweep said mixture of vapors of the carrier gas and solid precursor into said reactor to coat said substrate. The carrier gas may be inert or reactive.

More specifically, the method of the present invention is used in conjunction with a procedure which is embodied within a method of depositing a metal or other desired material onto a suitable substrate. The novel method consists of the (1) introduction of a suitable substrate into a CVD or other deposition chamber; (2) bringing the substrate to the appropriate deposition temperature; and (3) flowing over it a gaseous mixture comprising a precursor molecule or molecules in a carrier gas, which may or may not be reactive with the precursor, (4) allowing deposition to take place to the desired degree, (5) shutting off the flow of precursor vapor and evacuating the chamber, and finally (6) cooling and removing the processed substrate.

The present invention comprises the means by which step (3) noted above is effected for low vapor pressure solid precursors that are utilized within the total process described above. The present invention employs a method which has all of the advantages of the liquid bubbler delivery system described above, without adding significant amounts of unwanted molecular species to the delivered gas flow, without lowering the vapor pressure of the precursor from the value exhibited by the pure substance, and preventing recrystallization of the precursor. This object is achieved by mixing the solid precursor with an inert carrier such as diffusion pump oil, and placing the resultant mixture, which can be a slurry, or an emulsion, into a standard liquid bubbler and then operate same in normal fashion. This procedure does not introduce any significant amounts of chemical species other than the desired precursor and carrier gas into the gas stream delivered to the reactor. The insolubility of the precursor in the liquid retards the process of its recrystallization and enhances the long term reproducibility of the process. This is because the high quality carrier liquids such as the pump oil, have been developed to have a negligible vapor pressure at room temperature and the precursors employed are such as to be insoluble in the oil. The carrier liquid has a vapor pressure in the range of $10^{-9}$ to $10^{-12}$ Torr, while the precursor must have a vapor pressure greater than about $10^{-4}$ Torr to be at all operative within the scope of the present invention.

In summary, the present invention relates to a method of delivering a gas arising from a low vapor pressure solid to a reactor in such a manner as to exhibit efficiency and long term stability.

While the method of the present invention is envisioned as being applied to CVD, it can be used in any application wherein the manner of the vapor emanating from a low vapor pressure solid is desired.

Other objects and features as well as additional details of the present invention will become apparent from the following detailed description and annexed drawings of the presently preferred embodiments thereof, when considered in conjunction with the drawings.

DETAILED DESCRIPTION OF THE PREFERRED EMBODIMENT

The specific method of the present invention in using the bubbler delivery system for precursors using a liquid having negligible or ultra-low vapor pressure to contain the precursor is defined as follows. A substrate onto which an overlayer, such as refractory metallic tungsten, etc., is to be deposited is introduced via a load lock as depicted into the deposition chamber. The material is typically silicon, silicon dioxide or silicon nitride, however any material may used provided it can withstand heating.

The reactor used in accordance with the present invention may be any standard type, but for illustrative purposes, it is preferably a stainless steel, cold wall, ultrahigh vacuum system with a base pressure, better than $1\times10^{-6}$ Torr, preferably better than $1\times10^{-7}$ Torr, most preferably $1\times10^{-9}$. The low pressure of the system is desirable, in order that the oxygen partial pressure can be accurately and reproducibly controlled. The substrate is heated to the deposition temperature, which varies according to the substrate and the specific deposition method.

Figure 1:
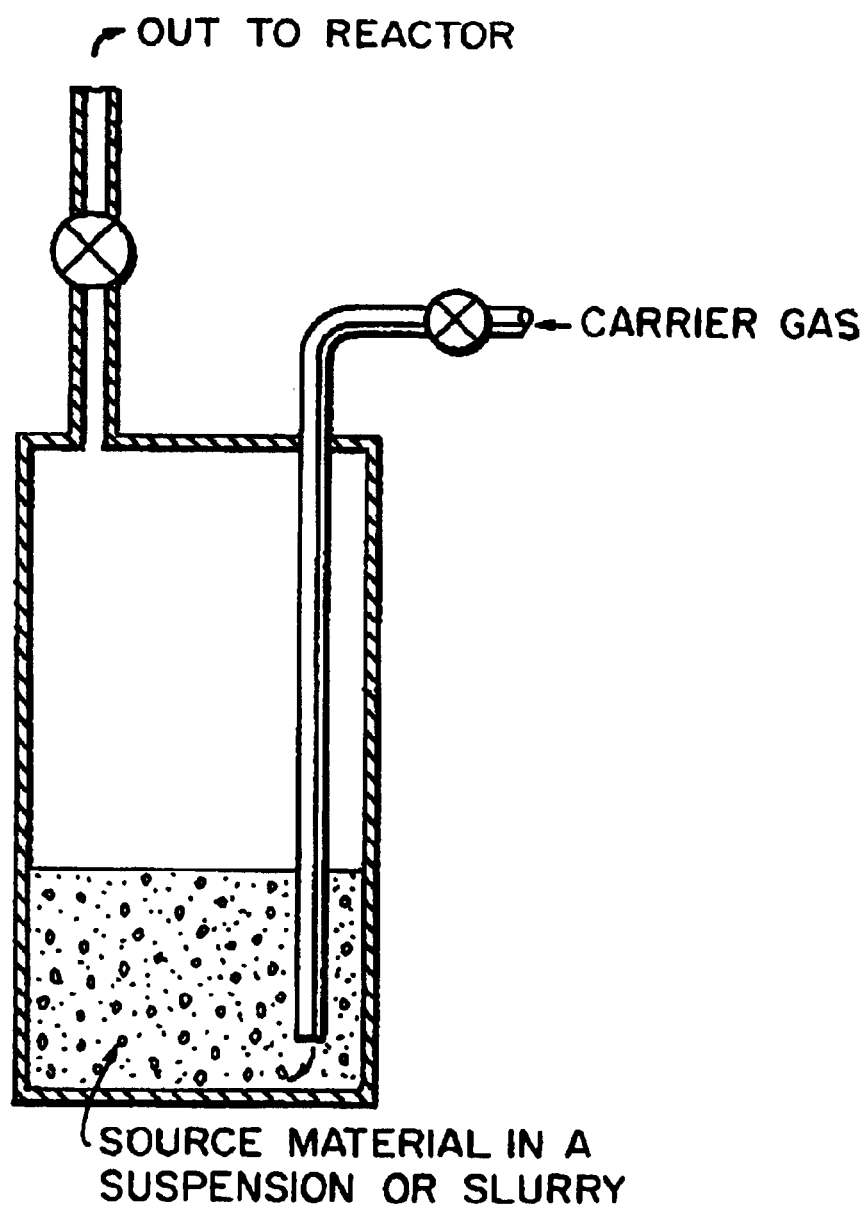
FIG. 1 depicts a bubbler delivery system showing the elements used in the present invention.
Figure 2:
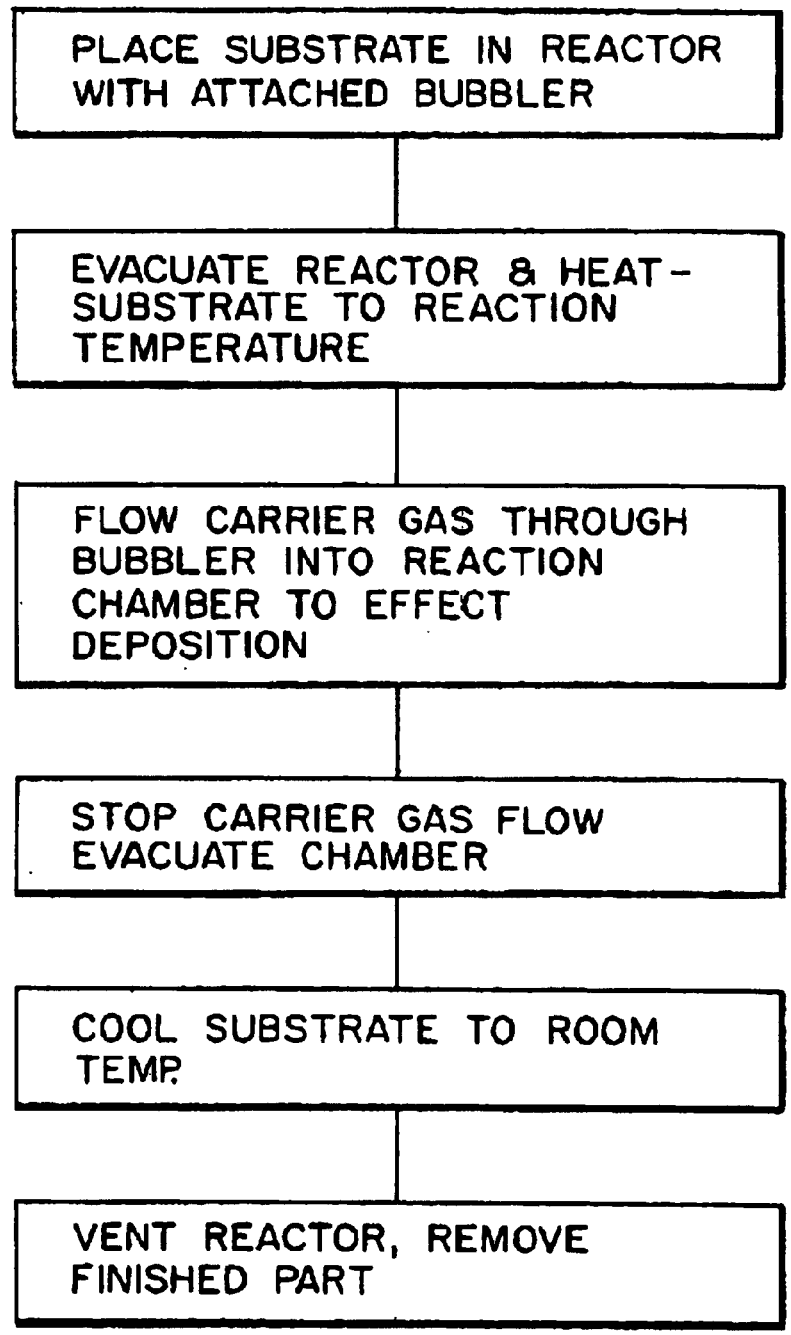
FIG. 2 shows a block diagram of the steps of the process of the present invention.

The present invention is illustrated by using the specific method to deposit films of W from the precursor $W(CO)_6$. A substrate of $SiO_2$ was placed in a steel reactor as noted above and heated to approximately 400° C. A bubbler such as depicted in FIG. 1 was previously attached to this system. The solid material in the bubbler comprised $W(CO)_6$. The liquid in the bubbler comprised Dow Corning Type 705 diffusion pump oil, a high molecular weight silicone compound with vapor pressure approximately $10^{-10}$ Torr at room temperature, in which the $W(CO)_6$ exhibits no measurable solubility (see below). A carrier gas, hydrogen or argon, was directed to flow through the bubbler at flow rates of typically 50–250 standard cc/min (sccm). The combined pressure of the carrier gas-precursor mixture in the chamber was held in the range of 50–500 m Torr. Using these conditions, tungsten films were routinely deposited, following standard practices. Analogously films of tungsten nitride were also prepared using the procedure described above but substituting ammonia for the carrier gas.

To demonstrate that the $W(CO)_6$ was truly insoluble in the liquid. and different from the protocol of Frigo et al., the following test was performed.

Tungsten hexacarbonyl was suspended in Dow Corning type 705 diffusion pump oil for approximately one month. Periodically, either argon or ammonia was bubbled through the suspension during the growth of tungsten metal or tungsten nitride. Occasionally the suspension was warmed to 70° C. during growth. After approximately one month of use, a sample of pump oil was extracted from the bubbler containing solid tungsten hexacarbonyl particles. Approximately 0.2 g of the extracted sample consisting of pump oil and solid tungsten hexacarbonyl was dissolved in 0.5 ml of deuterated toluene and analyzed by $^{13}C$ nuclear magnetic resonance (NMR). Tungsten hexacarbonyl is known to be soluble in toluene. The NMR spectra were recorded on a Bruker 250 MHz spectrometer using the $^{13}C$ resonance of toluene as a reference for the $^{13}C$ spectra. After collecting 2,527 scans, a peak at 191 ppm was observed as assigned to the carbonyl resonance of tungsten hexacarbonyl. The experiment was repeated with a sample of extracted pump oil which did not contain any solid tungsten hexcarbonyl particles. Approximately 0.2 g of pump oil which did not contain any visible tungsten hexacarbonyl particles was dissolved in deuterated toluene and analyzed by $^{13}C$ nuclear magnetic resonance (NMR). After collecting 63,928 scans, no peaks attributable to tungsten hexacarbonyl were observed. Therefore, it was concluded that tungsten hexacarbonyl is insoluble in the liquid carrier, in this case, liquid pump oil to the limits of $^{13}C$ NMR detection.

When the deposition is complete, the reactor is evacuated and the substrate is held at 500° C., the deposition temperature at which the sample is annealed. The substrate was then cooled and removed from the reactor.

The preceding experiment shows that the upper limit of the concentration of the $W(CO)_6$ in the diffusion pump oil was approximately 50 parts per million (ppm) by weight; that is greater than 99.995% insoluble. This is considered to be a more than adequate demonstration of insolubility. This raises the question of the definition of the term "insoluble." There is considerable leeway in the definition of this word. The most extreme viewpoint, (which from the perspective of the present invention is rejected as being contrary to all common usage of the word by a trained chemist) is that there is no such thing as "Insolubility." According to this viewpoint, as long as the difference in chemical potential of the solid between the solid phase and the solution phase is not infinite (and it never is), one can always in principle calculate the concentration of any solid in any liquid; it is merely a matter of degree. However this approach blithely includes situations where many liters of "solution" would be required to have a reasonable probability of having a single molecule of "solute" included. Clearly this viewpoint does violence to the common technical use of the word. Standard reference works in chemistry make use of the term "insoluble" freely and intend it to be meaningful. Clearly "insoluble" is intended in these cases as in ours to refer to mixtures which produce "solutions" of sufficiently low concentration that the amount of solute in the liquid phase is for practical purposes entirely negligible. This is somewhat application dependent. In the instant case, that would mean a situation in which the crystalline morphology of the precursor material does not change to a measurable extent during the time necessary to use up the precursor in normal operation and necessitate refilling the bubbler. In the instant case, with respect to the experiment set forth above, no changes were observed in the physical appearance of the $W(CO)_6$ in the bubbler consistent with recrystallization, even when it was allowed to stand for over 3 months. It is estimated on this basis that an insolubility (by weight) of 99.9% is probably sufficient to constitute practical insolubility in the envisioned applications.

Thus, while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition it is to be understood that the drawings are not necessarily drawn to scale but that they are merely conceptual in nature. It is the intention, therefore, to be limited only as indicated by the scope of the claims appended herewith.

Having thus described our invention, what we claim as new and desire to secure by Letters Patent is as follows:

1. A method of an improved delivery system for gases generated via the sublimation of solid material precursors comprising:

introducing a solid powder precursor into a liquid bubbler apparatus;

adding a liquid into said solid powder precursor-containing bubbler apparatus, said liquid chosen to have a vapor pressure which is negligible compared with said vapor pressure of said solid powder precursor under the operating conditions extant in said bubbler; said liquid also being chosen such that said solid powder precursor is sufficiently insoluble in said liquid such that recrystallization of material of said solid powder precursor is unobservable during the normal operating time required to deplete the precursor material in said bubbler and necessitate its refilling;

attaching said bubbler containing said solid powder precursor and said liquid to a reactor apparatus containing a substrate to which said powder precursor is to be applied; said bubbler containing a mixture of vapors comprising carrier gas and solid powder precursor;

said mixture of vapors being formed, when said carrier gas contacts said liquid in said bubbler, forming bubbles therein which agitate and mix in said liquid, said vapors comprising carrier gas and composition of said solid powder precursor;

said carrier gas being either inert or reactive;

flowing said carrier gas through said bubbler to sweep said mixture of vapors into said reactor to coat said substrate.

2. The method defined in claim 1 wherein the vapor pressure of said liquid is less than $10^{-8}$ Torr at room temperature.

3. The method defined in claim 1 wherein said solid precursor is any material having a solubility in said liquid of less than 1000 ppm.

4. The method defined in claim 3 wherein said solid precursor is any material having a solubility of less than 100 ppm.

5. The method defined in claim 3 wherein said liquid is a silicone oil oligomer.

6. The method defined in claim 3 wherein said solid precursor material is a compound containing a metal selected from the group consisting of molybdenum, niobium, tantalum and tungsten.

7. The method defined in claim 6 wherein said solid precursor material is tungsten.

8. The method defined in claim 6 wherein said solid precursor material is tungsten hexacarbonyl.

9. The method defined in claim 6 wherein wherein said substrate comprises silicon, silicon dioxide or silicon nitride.

10. The method defined in claim 3 wherein said solid precursor material is a compound containing a metal selected from the group consisting of molybdenum, niobium, tantalum and tungsten.

11. The method defined in claim 1 wherein:

said solid precursor is a compound containing a metal selected from the group consisting of molybdenum, niobium, tantalum and tungsten;

said liquid added to said solid precursor-containing bubbler apparatus has a vapor pressure less than $10^{-8}$ Torr at room temperature;

said solid precursor has a solubility in said liquid of less than 1000 ppm;

and said substrate to which said precursor is to be applied is selected from the group consisting of silicon, silicon dioxide or silicon nitride;

said carrier gas being either a noble gas or ammonia.

12. The method defined in claim 11 wherein said metal in said compound forming said solid precursor is tungsten, said liquid is a silicon oil oligomer and said carrier gas is argon.

13. The method defined in claim 12 wherein said carrier gas is ammonia.

14. The method defined in claim 13 wherein said coated substrate is annealed.

15. The method defined in claim 14 wherein the temperature in the reactor in in the range of between about 200° C. and 600° C.

16. The method defined in claim 1 wherein said solid precursor has a solubility in said liquid of less than 100 ppm.

* * * * *